United States Patent
Citla et al.

(10) Patent No.: US 9,640,385 B2
(45) Date of Patent: May 2, 2017

(54) GATE ELECTRODE MATERIAL RESIDUAL REMOVAL PROCESS

(71) Applicant: Applied Materials, Inc., Santa Clara, CA (US)

(72) Inventors: Bhargav Citla, Fremont, CA (US); Chentsau Ying, Cupertino, CA (US); Srinivas D. Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/000,273

(22) Filed: Jan. 19, 2016

(65) Prior Publication Data

US 2016/0240385 A1 Aug. 18, 2016

Related U.S. Application Data

(60) Provisional application No. 62/116,808, filed on Feb. 16, 2015.

(51) Int. Cl.
*H01L 21/02* (2006.01)
*H01L 21/28* (2006.01)
*H01L 21/3213* (2006.01)

(52) U.S. Cl.
CPC .. *H01L 21/02071* (2013.01); *H01L 21/28035* (2013.01); *H01L 21/32137* (2013.01)

(58) Field of Classification Search
CPC .......... H01L 21/3065; H01L 21/02068; H01L 21/28035; H01L 21/28158; H01L 21/28; H01L 21/02; H01L 21/02071; H01L 21/32137
See application file for complete search history.

(56) References Cited

U.S. PATENT DOCUMENTS 5,453,156 A * 9/1995 Cher ................. H01L 21/32137
257/E21.312
5,626,775 A 5/1997 Roberts et al.
5,854,137 A * 12/1998 Kuo .................. H01L 21/32137
257/E21.312

(Continued)

FOREIGN PATENT DOCUMENTS

| JP | 2013030531 A | 2/2013 |
|----|--------------|--------|
| KR | 100777043 B1 | 11/2007 |
| KR | 100838394 B1 | 6/2008 |

OTHER PUBLICATIONS

International Search Report and Written Opinion for PCT/US2016/015526 dated Apr. 29, 2016 (8 pgs.).

*Primary Examiner* — Scott B Geyer
(74) *Attorney, Agent, or Firm* — Patterson + Sheridan, LLP (57) ABSTRACT

The present disclosure provides methods for removing gate electrode residuals from a gate structure after a gate electrode patterning process. In one example, a method for forming high aspect ratio features in a gate electrode layer in a gate structure includes performing an surface treatment process on gate electrode residuals remaining on a gate structure disposed on a substrate, selectively forming a treated residual in the gate structure on the substrate with some untreated regions nearby in the gate structure, and performing a remote plasma residual removal process to remove the treated residual from the substrate.

19 Claims, 4 Drawing Sheets

(56) References Cited

U.S. PATENT DOCUMENTS

| | | | | |
|---|---|---|---|---|
| 6,033,990 A * | 3/2000 | Kishimoto | ........ | H01L 21/02063 257/E21.252 |
| 6,057,240 A * | 5/2000 | Zhou | ........ | B82Y 10/00 106/14.15 |
| 6,107,206 A * | 8/2000 | Chao | ........ | H01L 21/3065 257/E21.218 |
| 6,127,278 A * | 10/2000 | Wang | ........ | H01L 21/3065 216/67 |
| 6,235,643 B1 | 5/2001 | Mui et al. | | |
| 6,300,251 B1 * | 10/2001 | Pradeep | ........ | H01L 21/31116 257/E21.252 |
| 6,303,482 B1 * | 10/2001 | Wu | ........ | H01L 21/02052 134/1.2 |
| 6,432,832 B1 * | 8/2002 | Miller | ........ | H01L 21/3065 257/E21.218 |
| 6,544,896 B1 * | 4/2003 | Xu | ........ | H01L 21/32137 257/E21.312 |
| 6,617,244 B2 | 9/2003 | Nishizawa | | |
| 6,686,292 B1 * | 2/2004 | Yang | ........ | H01L 21/3065 257/E21.218 |
| 6,753,264 B2 | 6/2004 | Li et al. | | |
| 6,864,183 B2 * | 3/2005 | Maekawa | ........ | H01L 21/28518 257/E21.165 |
| 6,943,120 B1 * | 9/2005 | Huang | ........ | H01L 21/31116 438/713 |
| 7,064,079 B2 * | 6/2006 | Sonoda | ........ | B08B 3/08 438/720 |
| 7,153,781 B2 * | 12/2006 | Lee | ........ | H01L 21/28123 257/E21.206 |
| 7,368,392 B2 * | 5/2008 | Choi | ........ | H01L 21/28123 257/750 |
| 7,485,579 B2 * | 2/2009 | Sasagawa | ........ | H01L 21/02071 216/37 |
| 7,683,447 B2 | 3/2010 | Wang et al. | | |
| 7,691,749 B2 | 4/2010 | Levy et al. | | |
| 7,700,490 B2 * | 4/2010 | Matsumura | ........ | H01L 22/20 438/444 |
| 7,759,244 B2 * | 7/2010 | Wang | ........ | H01L 21/02063 257/E21.022 |
| 7,767,977 B1 | 8/2010 | Godet et al. | | |
| 7,888,653 B2 | 2/2011 | Kellerman et al. | | |
| 8,101,510 B2 | 1/2012 | Godet et al. | | |
| 8,969,211 B2 * | 3/2015 | Muto | ........ | H01L 21/3065 216/67 |
| 2003/0207594 A1 * | 11/2003 | Catabay | ........ | H01L 21/31058 438/778 |
| 2003/0228532 A1 | 12/2003 | Mui et al. | | |
| 2004/0063314 A1 * | 4/2004 | Sharan | ........ | H01L 21/76814 438/683 |
| 2004/0072440 A1 | 4/2004 | Kim et al. | | |
| 2004/0203177 A1 | 10/2004 | Davis et al. | | |
| 2005/0026431 A1 | 2/2005 | Kazumi et al. | | |
| 2005/0064719 A1 | 3/2005 | Liu et al. | | |
| 2005/0106868 A1 * | 5/2005 | Yamashita | ........ | H01L 21/32137 438/689 |
| 2008/0057724 A1 | 3/2008 | Kiehlbauch et al. | | |
| 2008/0113516 A1 | 5/2008 | Takeshita et al. | | |
| 2008/0145998 A1 | 6/2008 | Delgadino et al. | | |
| 2008/0305644 A1 * | 12/2008 | Noda | ........ | H01L 21/3065 438/733 |
| 2009/0004875 A1 | 1/2009 | Shen et al. | | |
| 2009/0085173 A1 | 4/2009 | Boemmels et al. | | |
| 2009/0104782 A1 | 4/2009 | Lu et al. | | |
| 2010/0018460 A1 | 1/2010 | Singh et al. | | |
| 2010/0200993 A1 | 8/2010 | Cui et al. | | |
| 2012/0135273 A1 | 5/2012 | Horng et al. | | |
| 2012/0135543 A1 | 5/2012 | Shin et al. | | |
| 2013/0034968 A1 | 2/2013 | Zhang et al. | | |
| 2013/0056024 A1 * | 3/2013 | Hoshino | ........ | H01L 21/02063 134/1.3 |
| 2013/0252355 A1 * | 9/2013 | Liao | ........ | H01L 21/28123 438/17 |
| 2014/0038311 A1 | 2/2014 | Kim et al. | | |
| 2014/0209562 A1 * | 7/2014 | LaVoie | ........ | C23C 16/045 216/2 |
| 2015/0118839 A1 * | 4/2015 | Bruce | ........ | H01L 21/0206 438/595 |
| 2015/0214099 A1 * | 7/2015 | Grenouillet | ........ | H01L 21/266 438/424 |

\* cited by examiner

GATE ELECTRODE MATERIAL RESIDUAL REMOVAL PROCESS

CROSS-REFERENCE TO RELATED APPLICATIONS

This application claims benefit of U.S. Provisional Application Ser. No. 62/116,808 filed Feb. 16, 2015, which is incorporated by reference in its entirety.

BACKGROUND

Field

Embodiments of the present invention generally relate to methods for removing gate residuals in a gate structure, and more particularly to methods for removing gate electrode residuals in a gate structure from a substrate after features are formed in a gate electrode layer for semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features. In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. In manufacturing three dimensional (3D) stacking of semiconductor chips, stair-like structures are often utilized to allow multiple interconnection structures to be disposed thereon, forming high-density of vertical transistor devices.

When forming features, such as trenches or vias, in stair-like structures or gate structures in a film stack disposed on a substrate, an etch process using a photoresist layer as an etching mask is often utilized. In gate structures, a gate electrode is formed over a gate dielectric with high aspect ratios. Typically, conventional etchants have low selectivity to etch gate electrode materials over other materials present in the gate structure, such as gate dielectric and/or underlying materials, thereby leaving void space, also known as silicon recess, foot, or other associated defects on the interface of the gate electrode over the gate dielectric or other materials. The gate electrode foot effect may become severe when etching features into the gate electrode material with high aspect ratio, resulting in higher amount of gate electrode material residuals left on sidewalls, corners, or bottom the substrate surface.

Thus, the etch selectivity for the gate electrode layer (e.g., polysilicon and silicon materials) to other materials on the gate structures, such as silicon oxide or silicon nitride, has to be very high in order to protect or passivate the sidewall of the gate electrode layer or the surface of the underlying gate structure.

Thus, there is a need for improved methods for etching or removing gate electrode with minimum defects and residuals for gate structures at semiconductor chip manufacture applications or other semiconductor devices.

SUMMARY

The present disclosure provides methods for removing gate electrode residuals from a gate structure after a gate electrode patterning process. In one example, a method for forming high aspect ratio features in a gate electrode layer in a gate structure includes performing an surface treatment process on gate electrode residuals remaining on the gate structure formed on a substrate, selectively forming from the gate electrode residuals remaining on the gate structure regions of treated residuals and regions of untreated residuals, and performing a remote plasma residual removal process to remove the treated residuals from the substrate.

In another example, a method for forming high aspect ratio features in a gate electrode layer in a gate structure includes altering film properties of gate electrode residuals on a gate structure formed on a substrate, and selectively removing the gate electrode residuals from the substrate.

In yet another example, a method for forming high aspect ratio features in a gate electrode layer in a gate structure includes selectively treating gate electrode residuals remaining on a substrate after patterning a gate electrode layer disposed in a gate structure formed on a substrate, and selectively removing the treated gate electrode residuals from the gate structures using a plasma formed from a gas mixture containing $H_2$ gas generated by a remote plasma source.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention generally relate to methods and apparatus for removing gate electrode residuals from a gate structure after a gate electrode patterning process. In one example, the method includes incremental removal of gate electrode residuals with high etching selectivity so as to maintain a desired profile and dimension of the gate structure. In one example, the multiple-step gate electrode residual process includes a treatment process followed by a residual removal process. The treatment process primarily alters the film structures of the gate electrode residuals, rendering the gate electrode residuals in a state that allows for efficient removed during a subsequent residual removal process. The treatment process and the residual removal process may be performed repeatedly until substantially all the gate electrode residuals are removed from the gate structure formed on the substrate.

Figure 1:
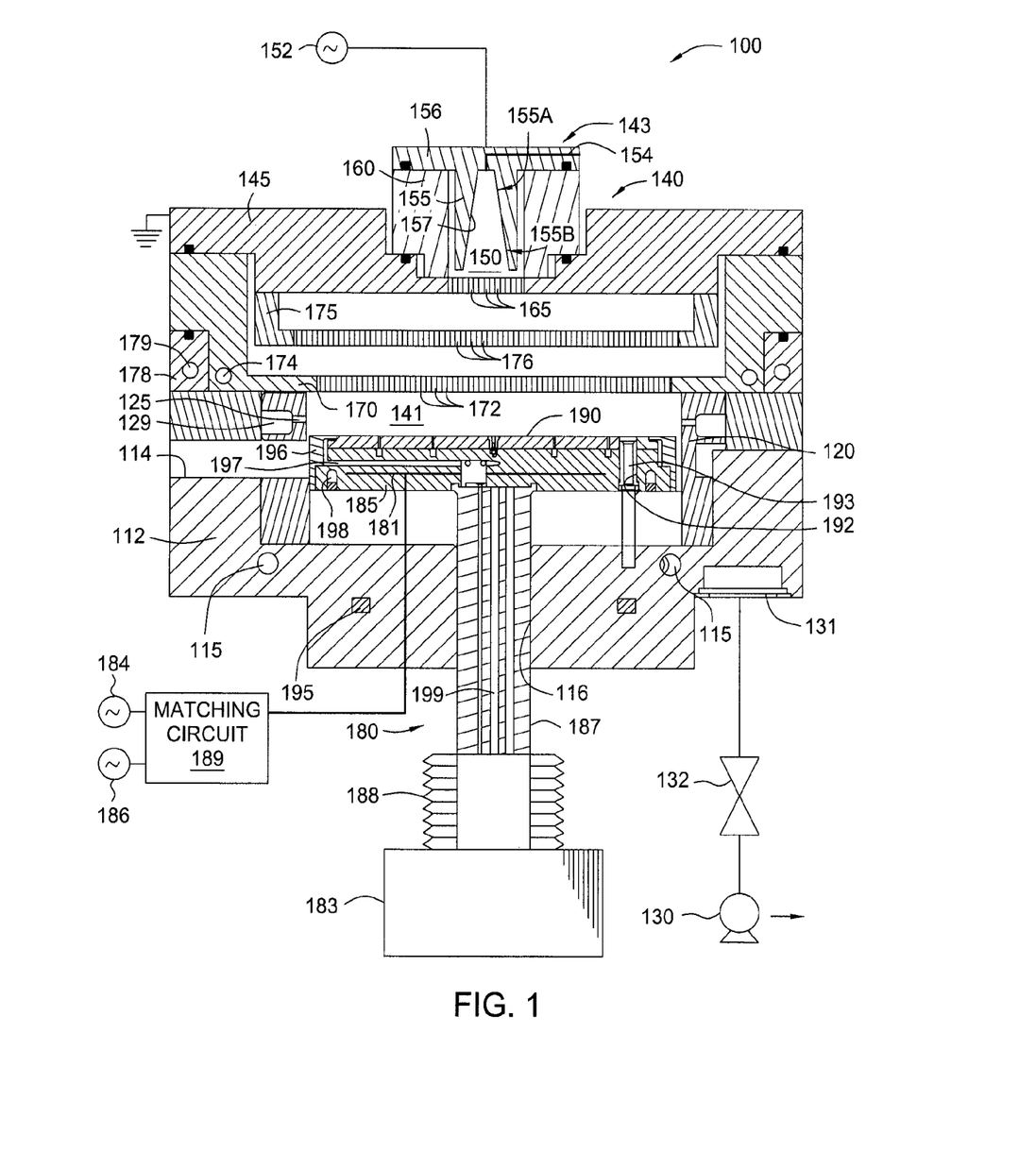
FIG. 1 depicts an etching processing chamber which may be utilized to perform an etching process on a substrate.

FIG. 1 is a cross sectional view of an illustrative processing chamber 100 suitable for conducting a gate electrode residual removal process as further described below. The chamber 100 may be configured to remove materials from a material layer disposed on a substrate surface. The chamber 100 is particularly useful for performing the plasma assisted dry etch process. The processing chamber 100 may be a PCxT Reactive Preclean™ (RPC), AKTIV Pre-Clean™, Siconi™, Capa™, or Frontier™ chamber, which is available from Applied Materials, Santa Clara, Calif. It is noted that other vacuum processing chambers available from other manufactures may also be adapted to practice the present invention.

The processing chamber 100 includes a chamber body 112, a lid assembly 140, and a support assembly 180. The lid assembly 140 is disposed at an upper end of the chamber body 112, and the support assembly 180 is at least partially disposed within the chamber body 112.

The chamber body 112 includes a slit valve opening 114 formed in a sidewall thereof to provide access to the interior of the processing chamber 100. The slit valve opening 114 is selectively opened and closed to allow access to the interior of the chamber body 112 by a wafer handling robot (not shown).

In one or more implementations, the chamber body 112 includes a channel 115 formed therein for flowing a heat transfer fluid therethrough. The chamber body 112 can further include a liner 120 that surrounds the support assembly 180. The liner 120 is removable for servicing and cleaning. In one or more embodiments, the liner 120 includes one or more apertures 125 and a pumping channel 129 formed therein that is in fluid communication with a vacuum system. The apertures 125 provide a flow path for gases into the pumping channel 129, which provides an egress for the gases within the processing chamber 100.

The vacuum system can include a vacuum pump 130 and a throttle valve 132 to regulate flow of gases through the processing chamber 100. The vacuum pump 130 is coupled to a vacuum port 131 disposed in the chamber body 112 and therefore, in fluid communication with the pumping channel 129 formed within the liner 120. The lid assembly 140 includes at least two stacked components configured to form a plasma volume or cavity therebetween. In one or more embodiments, the lid assembly 140 includes a first electrode 143 ("upper electrode") disposed vertically above a second electrode 145 ("lower electrode") confining a plasma volume or cavity 150 therebetween. The first electrode 143 is connected to a power source 152, such as an RF power supply, and the second electrode 145 is connected to ground, forming a capacitance between the two electrodes 143,145.

In one or more implementations, the lid assembly 140 includes one or more gas inlets 154 (only one is shown) that are at least partially formed within an upper section 156 of the first electrode 143. The one or more process gases enter the lid assembly 140 via the one or more gas inlets 154. The one or more gas inlets 154 are in fluid communication with the plasma cavity 150 at a first end thereof and coupled to one or more upstream gas sources and/or other gas delivery components, such as gas mixers, at a second end thereof. In one or more embodiments, the first electrode 143 has an expanding section 155 that houses the plasma cavity 150.

In one or more implementations, the expanding section 155 is an annular member that has an inner surface or diameter 157 that gradually increases from an upper portion 155A thereof to a lower portion 155B thereof. As such, the distance between the first electrode 143 and the second electrode 145 is variable. That varying distance helps control the formation and stability of the plasma generated within the plasma cavity 150. A plasma generated in the plasma cavity 150 is defined in the lid assembly 140 prior to entering into a processing region 141 above the support assembly 180 wherein the substrate is proceed, the plasma is considered as a remote plasma source that generated remotely from the processing region 141.

The lid assembly 140 can further include an isolator ring 160 that electrically isolates the first electrode 143 from the second electrode 145. The lid assembly 140 can further include a distribution plate 170 and blocker plate 175 adjacent the second electrode 145. The second electrode 145, distribution plate 170 and blocker plate 175 can be stacked and disposed on a lid rim 178 which is connected to the chamber body 112. In one or more implementations, the second electrode 145 can include a plurality of gas passages or apertures 165 formed beneath the plasma cavity 150 to allow gas from the plasma cavity 150 to flow therethrough. The distribution plate 170 is substantially disc-shaped and also includes a plurality of apertures 172 or passageways to distribute the flow of gases therethrough. In one or more embodiments, the distribution plate 170 includes one or more embedded channels or passages 174 for housing a heater or heating fluid to provide temperature control of the lid assembly 140. The blocker plate 175 includes a plurality of apertures 176 to provide a plurality of gas passages from the second electrode 145 to the distribution plate 170. The apertures 176 can be sized and positioned about the blocker plate 175 to provide a controlled and even flow distribution of gases to the distribution plate 170.

The support assembly 180 can include a support member 185 to support a substrate (not shown in this view) for processing within the chamber body 112. The support member 185 can be coupled to a lift mechanism 183 through a shaft 187 which extends through a centrally-located opening 116 formed in a bottom surface of the chamber body 112. The lift mechanism 183 can be flexibly sealed to the chamber body 112 by a bellows 188 that prevents vacuum leakage from around the shaft 187.

In one embodiment, the electrode 181 that is coupled to a plurality of RF bias power sources 184, 186. The RF bias power sources 184, 186 are coupled between the electrode 181 disposed in the support member 185. The RF bias power excites and sustains a plasma discharge formed from the gases disposed in the processing region 141 of the chamber body.

In the embodiment depicted in FIG. 1, the dual RF bias power sources 184, 186 are coupled to the electrode 181 disposed in the support member 185 through a matching circuit 189. The signal generated by the RF bias power sources 184, 186 is delivered through matching circuit 189 to the support member 185 through a single feed to ionize the gas mixture provided in the plasma processing chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts. Additional bias power sources may be coupled to the electrode 181 to control the characteristics of the plasma as needed.

The support member 185 can include bores 192 formed therethrough to accommodate lift pins 193, one of which is shown in FIG. 1. Each lift pin 193 is constructed of ceramic or ceramic-containing materials, and are used for substrate-handling and transport. The lift pin 193 is moveable within its respective bore 192 when engaging an annular lift ring 195 disposed within the chamber body 112. The support assembly 180 can further include an edge ring 196 disposed about the support member 185.

The temperature of the support assembly 180 can be controlled by a fluid circulated through a fluid channel 198 embedded in the body of the support member 185. In one or more implementations, the fluid channel 198 is in fluid communication with a heat transfer conduit 199 disposed through the shaft 187 of the support assembly 180. The fluid channel 198 is positioned about the support member 185 to provide a uniform heat transfer to the substrate receiving surface of the support member 185. The fluid channel 198 and heat transfer conduit 199 can flow heat transfer fluids to either heat or cool the support member 185. Any suitable heat transfer fluid may be used, such as water, nitrogen, ethylene glycol, or mixtures thereof. The support assembly 180 can further include an embedded thermocouple (not shown) for monitoring the temperature of the support surface of the support member 185. For example, a signal from the thermocouple may be used in a feedback loop to control the temperature or flow rate of the fluid circulated through the fluid channel 198.

The support member 185 can be moved vertically within the chamber body 112 so that a distance between support member 185 and the lid assembly 140 can be controlled. A sensor (not shown) can provide information concerning the position of support member 185 within chamber 100.

A system controller (not shown) can be used to regulate the operations of the processing chamber 100. The system controller can operate under the control of a computer program stored on a memory of a computer. The computer program may include instructions that enable the preclean process described below to be performed in the processing chamber 100. For example, the computer program can dictate the process sequencing and timing, mixture of gases, chamber pressures, RF power levels, susceptor positioning, slit valve opening and closing, wafer cooling and other parameters of a particular process.

Figure 2:
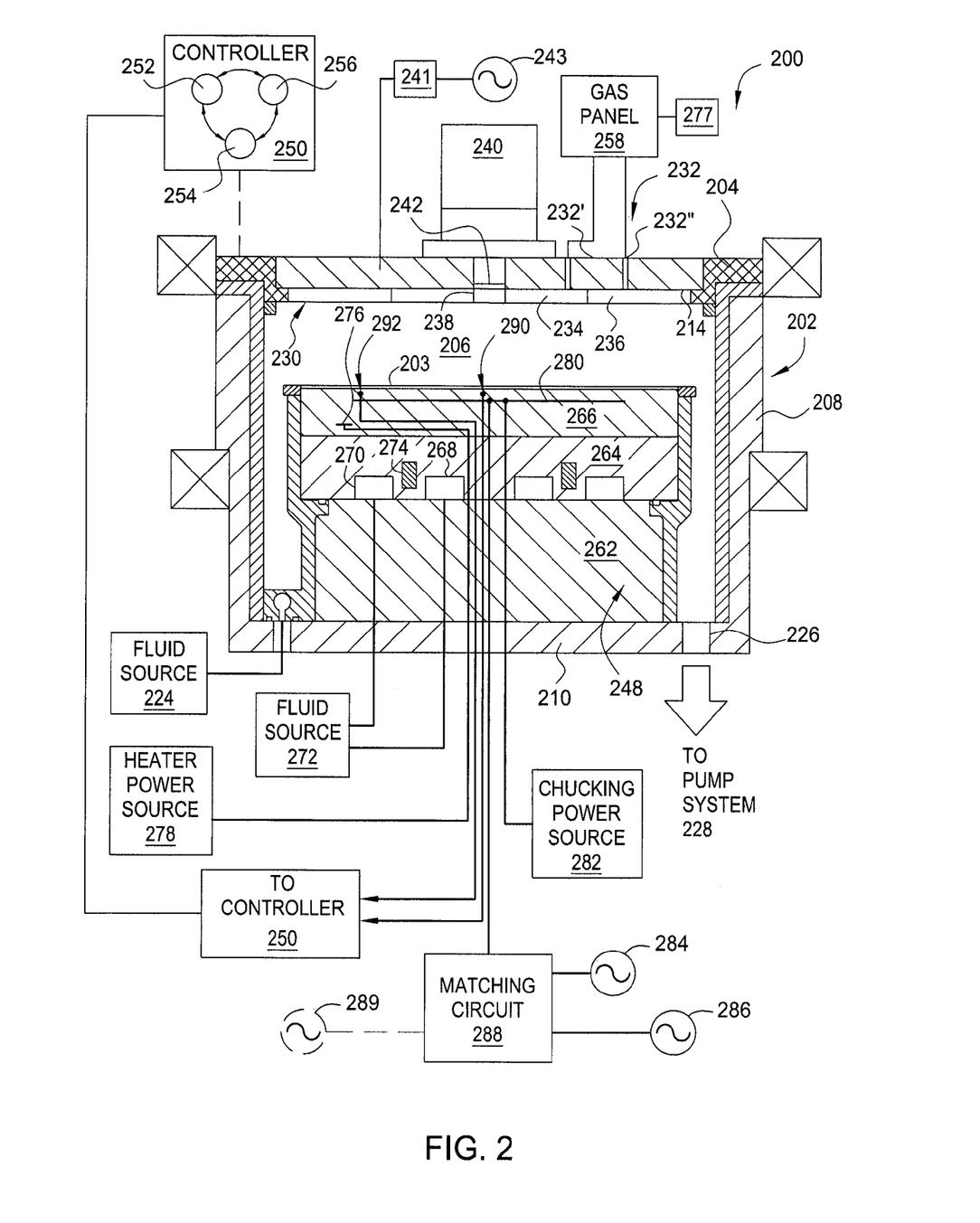
FIG. 2 depicts another example of an etching processing chamber which may be utilized to perform an etching process on a substrate.

FIG. 2 is a sectional view of one example of a processing chamber 200 suitable for performing a patterning process along with a gate electrode residual removal process to etch a gate electrode layer along with gate electrode residual removal on a substrate using an etching process. Suitable processing chambers that may be adapted for use with the teachings disclosed herein include, for example, an ENABLER® or C3® processing chamber available from Applied Materials, Inc. of Santa Clara, Calif. Although the processing chamber 200 is shown including a plurality of features that enable superior etching performance, it is contemplated that other processing chambers may be adapted to benefit from one or more of the inventive features disclosed herein.

The processing chamber 200 includes a chamber body 202 and a lid 204 which enclose an interior volume 206. The chamber body 202 is typically fabricated from aluminum, stainless steel or other suitable material. The chamber body 202 generally includes sidewalls 208 and a bottom 210. A substrate support pedestal access port (not shown) is generally defined in a sidewall 208 and a selectively sealed by a slit valve to facilitate entry and egress of a substrate 203 from the processing chamber 200. An exhaust port 226 is defined in the chamber body 202 and couples the interior volume 206 to a pump system 228. The pump system 228 generally includes one or more pumps and throttle valves utilized to evacuate and regulate the pressure of the interior volume 206 of the processing chamber 200. In one implementation, the pump system 228 maintains the pressure inside the interior volume 206 at operating pressures typically between about 10 mTorr to about 500 Torr.

The lid 204 is sealingly supported on the sidewall 208 of the chamber body 202. The lid 204 may be opened to allow excess to the interior volume 106 of the processing chamber 200. The lid 204 includes a window 242 that facilitates optical process monitoring. In one implementation, the window 242 is comprised of quartz or other suitable material that is transmissive to a signal utilized by an optical monitoring system 240 mounted outside the processing chamber 200.

The optical monitoring system 240 is positioned to view at least one of the interior volume 206 of the chamber body 202 and/or the substrate 203 positioned on a substrate support pedestal assembly 248 through the window 242. In one embodiment, the optical monitoring system 240 is coupled to the lid 204 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the invention is the EyeD® full-spectrum, interferometric metrology module, available from Applied Materials, Inc., of Santa Clara, Calif.

A gas panel 258 is coupled to the processing chamber 200 to provide process and/or cleaning gases to the interior volume 206. In the example depicted in FIG. 2, inlet ports 232', 232" are provided in the lid 204 to allow gases to be delivered from the gas panel 258 to the interior volume 206 of the processing chamber 200. In one implementation, the gas panel 258 is adapted to provide fluorinated process gas through the inlet ports 232', 232" and into the interior volume 206 of the processing chamber 200. In one implementation, the process gas provided from the gas panel 258 includes at least a fluorinated gas, chlorine, and a carbon-containing gas, an oxygen gas, a nitrogen-containing gas and a chlorine-containing gas. Examples of fluorinated and carbon-containing gases include $CHF_3$, $CH_2F_2$ and $CF_4$. Other fluorinated gases may include one or more of $C_2F$, $C_4F_6$, $C_3F_8$ and $C_5F_8$. Examples of the oxygen-containing gas include $O_2$, $CO_2$, $CO$, $N_2O$, $NO_2$, $O_3$, $H_2O$, and the like.

Examples of the nitrogen-containing gas include $N_2$, $NH_3$, $N_2O$, $NO_2$ and the like. Examples of the chlorine-containing gas include MCI, $Cl_2$, $CCl_4$, $CHCl_3$, $CH_2Cl_2$, $CH_3Cl$, and the like. Suitable examples of the carbon-containing gas include methane ($CH_4$), ethane ($C_2H_6$), ethylene ($C_2H_4$), and the like.

A showerhead assembly 230 is coupled to an interior surface 214 of the lid 204. The showerhead assembly 230 includes a plurality of apertures that allow the gases flowing through the showerhead assembly 230 from the inlet ports 232', 232" into the interior volume 206 of the processing chamber 200 in a predefined distribution across the surface of the substrate 203 being processed in the processing chamber 200.

A remote plasma source 277 may be optionally coupled to the gas panel 258 to facilitate dissociating gas mixture from a remote plasma prior to entering into the interior volume 206 for processing. A RF source power 243 is coupled through a matching network 241 to the showerhead assembly 230. The RF source power 243 typically is capable of producing up to about 3000 W at a tunable frequency in a range from about 50 kHz to about 200 MHz.

The showerhead assembly 230 additionally includes a region transmissive to an optical metrology signal. The optically transmissive region or passage 238 is suitable for allowing the optical monitoring system 240 to view the interior volume 206 and/or the substrate 203 positioned on the substrate support pedestal assembly 248. The passage 238 may be a material, an aperture or plurality of apertures formed or disposed in the showerhead assembly 230 that is substantially transmissive to the wavelengths of energy generated by, and reflected back to, the optical monitoring system 240. In one embodiment, the passage 238 includes a window 242 to prevent gas leakage through the passage 238. The window 242 may be a sapphire plate, quartz plate or other suitable material. The window 242 may alternatively be disposed in the lid 204.

In one implementation, the showerhead assembly 230 is configured with a plurality of zones that allow for separate control of gas flowing into the interior volume 206 of the processing chamber 200. In the example illustrated in FIG. 2, the showerhead assembly 230 as an inner zone 234 and an outer zone 236 that are separately coupled to the gas panel 258 through separate inlet ports 232', 232".

The substrate support pedestal assembly 248 is disposed in the interior volume 206 of the processing chamber 200 below the gas distribution (showerhead) assembly 230. The substrate support pedestal assembly 248 holds the substrate 203 during processing. The substrate support pedestal assembly 248 generally includes a plurality of lift pins (not shown) disposed therethrough that are configured to lift the substrate 203 from the substrate support pedestal assembly 248 and facilitate exchange of the substrate 203 with a robot (not shown) in a conventional manner. An inner liner 218 may closely circumscribe the periphery of the substrate support pedestal assembly 248.

In one implementation, the substrate support pedestal assembly 248 includes a mounting plate 262, a base 264 and an electrostatic chuck 266. The mounting plate 262 is coupled to the bottom 210 of the chamber body 202 includes passages for routing utilities, such as fluids, power lines and sensor leads, among others, to the base 264 and the electrostatic chuck 166. The electrostatic chuck 266 comprises at least one clamping electrode 280 for retaining the substrate 203 below showerhead assembly 230. The electrostatic chuck 266 is driven by a chucking power source 282 to develop an electrostatic force that holds the substrate 203 to the chuck surface, as is conventionally known. Alternatively, the substrate 203 may be retained to the substrate support pedestal assembly 248 by clamping, vacuum or gravity.

At least one of the base 264 or electrostatic chuck 266 may include at least one optional embedded heater 276, at least one optional embedded isolator 274 and a plurality of conduits 268, 270 to control the lateral temperature profile of the substrate support pedestal assembly 248. The conduits 268, 270 are fluidly coupled to a fluid source 272 that circulates a temperature regulating fluid therethrough. The heater 276 is regulated by a power source 278. The conduits 268, 270 and heater 276 are utilized to control the temperature of the base 264, thereby heating and/or cooling the electrostatic chuck 266 and ultimately, the temperature profile of the substrate 203 disposed thereon. The temperature of the electrostatic chuck 266 and the base 264 may be monitored using a plurality of temperature sensors 290, 292. The electrostatic chuck 266 may further comprise a plurality of gas passages (not shown), such as grooves, that are formed in a substrate support pedestal supporting surface of the chuck 266 and fluidly coupled to a source of a heat transfer (or backside) gas, such as He. In operation, the backside gas is provided at controlled pressure into the gas passages to enhance the heat transfer between the electrostatic chuck 266 and the substrate 203.

In one implementation, the substrate support pedestal assembly 248 is configured as a cathode and includes an electrode 280 that is coupled to a plurality of RF bias power sources 284, 286. The RF bias power sources 284, 286 are coupled between the electrode 280 disposed in the substrate support pedestal assembly 248 and another electrode, such as the showerhead assembly 230 or ceiling (lid 204) of the chamber body 202. The RF bias power excites and sustains a plasma discharge formed from the gases disposed in the processing region of the chamber body 202.

In the example depicted in FIG. 2, the dual RF bias power sources 284, 286 are coupled to the electrode 280 disposed in the substrate support pedestal assembly 248 through a matching circuit 288. The signal generated by the RF bias power sources 284, 286 is delivered through matching circuit 189 to the substrate support pedestal assembly 248 through a single feed to ionize the gas mixture provided in the plasma processing chamber 200, thereby providing ion energy necessary for performing a deposition or other plasma enhanced process. The RF bias power sources 284, 286 are generally capable of producing an RF signal having a frequency of from about 50 kHz to about 200 MHz and a power between about 0 Watts and about 5000 Watts. An additional bias power source 289 may be coupled to the electrode 280 to control the characteristics of the plasma.

In one mode of operation, the substrate 203 is disposed on the substrate support pedestal assembly 248 in the plasma processing chamber 200. A process gas and/or gas mixture is introduced into the chamber body 202 through the showerhead assembly 230 from the gas panel 258. A vacuum pump system 228 maintains the pressure inside the chamber body 202 while removing deposition by-products.

A controller 250 is coupled to the processing chamber 200 to control operation of the processing chamber 200. The controller 250 includes a central processing unit (CPU) 252, a memory 254, and a support circuit 256 utilized to control the process sequence and regulate the gas flows from the gas panel 258. The CPU 252 may be any form of general purpose computer processor that may be used in an industrial setting. The software routines can be stored in the memory 254, such as random access memory, read only memory, floppy, or hard disk drive, or other form of digital storage. The support circuit 256 is conventionally coupled to the CPU 252 and may include cache, clock circuits, input/output systems, power supplies, and the like. Bi-directional communications between the controller 250 and the various components of the processing chamber 200 are handled through numerous signal cables.

Figure 3:
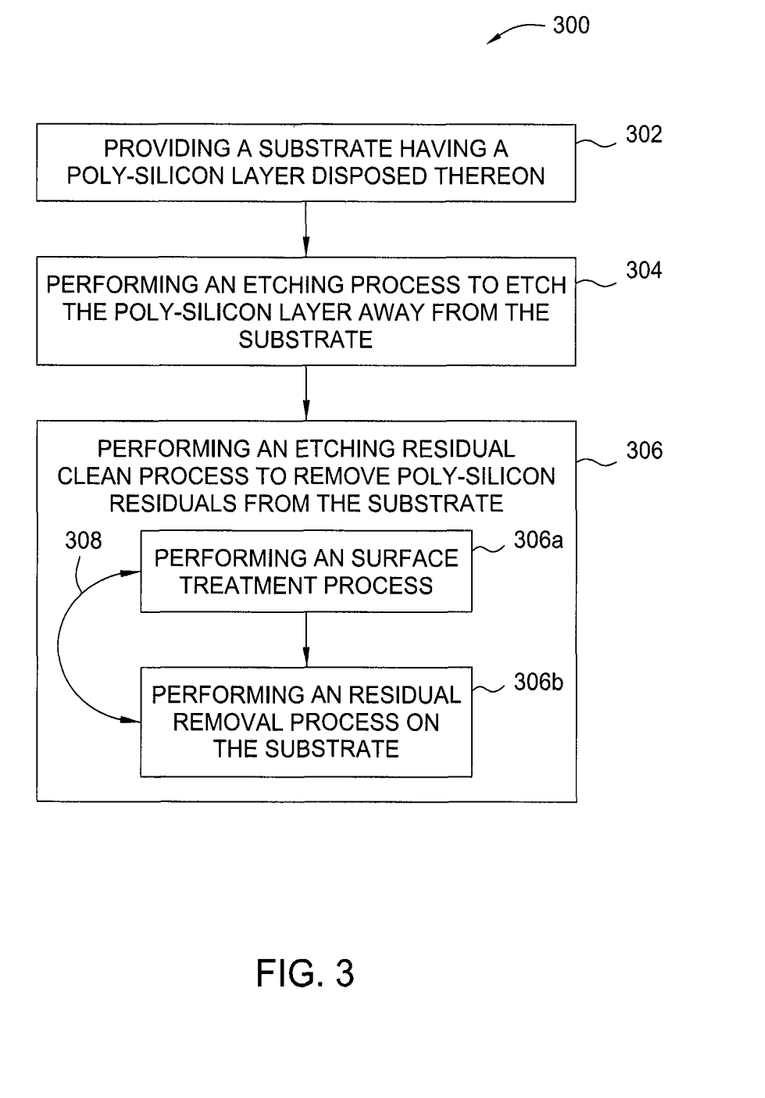
FIG. 3 depicts a flow diagram of a method for removing gate electrode residuals from a gate structure formed on a substrate.

FIG. 3 illustrates a method 300 for patterning a gate electrode layer and along with a gate electrode residual removal process performed on a substrate, which may be later utilized to form a gate structure for semiconductor devices. FIGS. 4A-4D are cross-sectional views of a portion of a gate electrode layer disposed on a composite substrate 400 with corresponding to various stages of the method 300. In one example, the gate electrode layer may be utilized to form gate structures for three dimensional (3D) NAND semiconductor applications. In manufacturing three dimensional (3D) NAND semiconductor applications, stair-like oxide-nitride pairs of structures are often utilized to high aspect ratio gate stack NAND cells so as to increase circuit density. Alternatively, the method 300 may be beneficially utilized to etch or remove residuals for other types of structures.

Figure 4A:
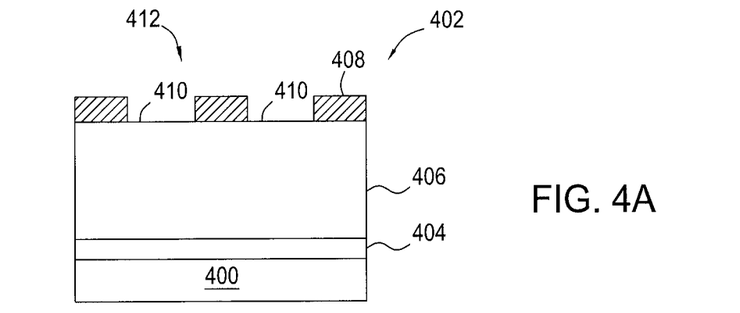
FIG. 4A-4D depict one example of cross sectional views of a sequence for removing gate electrode residuals from a gate structure depicted in FIG. 3.

The method 300 begins at operation 302 by providing a substrate, such as the substrate 400 depicted in FIG. 4A, having a film stack 402 formed thereon, as shown in FIG. 4A. The substrate 400 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 203 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate.

The film stack 402 includes at least a gate electrode layer 406 disposed on a gate dielectric layer 404, which may be later utilized to form a gate structure for semiconductor devices. In one embodiment, the gate electrode layer 406 may have a thickness between about 45 nm and about 70 nm and the gate dielectric layer 404 may have a thickness between about 7 nm and about 15 nm.

The gate electrode layer 406 may be a crystalline silicon layer, such as a single crystalline, polycrystalline, or monocrystalline silicon layer, formed by an epitaxial deposition process. Alternatively, the gate electrode layer 406 may be a doped silicon layer, including a p-type doped silicon layer or a n-type doped layer. Suitable p-type dopant includes B dopants, Al dopants, Ga dopants, In dopants, or the like. Suitable n-type dopant includes N dopants, P dopants, As dopants, Sb dopants, or the like. In yet another example, the gate electrode layer 406 may be a group III-V material, such as a GaAs layer, or tungsten polysilicon (W/poly), tantalum silicon nitride (TaSiN), and the like. In the embodiment depicted in FIG. 4A, the gate electrode layer 406 is a polysilicon layer having a thickness between about 45 nm and about 60 nm.

The gate dielectric layer 404 is a dielectric layer, such as silicon oxide, silicon nitride, silicon oxynitride, high-k material, or combinations thereof and the like. The high-k materials referred herein are dielectric materials having dielectric constants greater than 4.0. Suitable examples of the high-k material layer include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others. In the embodiment depicted in FIG. 4A, the gate dielectric layer 404 is a silicon oxide layer having a thickness between about 7 nm and about 15 nm.

A patterned mask layer 408 with a plurality of openings 412 formed therein may be disposed on the gate electrode layer 406, exposing a portion 410 of the gate electrode layer 406 to facilitate transferring features into the gate electrode layer 406. The patterned mask layer 408 may be a single layer of hardmask layer, photoresist layer, or a composite layer with both a hardmask layer and a photoresist layer. Suitable examples of the hardmask layer, if present, include silicon oxide, silicon nitride, silicon oxynitride, silicon carbide, silicon oxycarbide, amorphous carbon, titanium nitride, titanium oxide, titanium oxynitride, tantalum nitride, tantalum oxide, tantalum oxynitride, or any other suitable materials. The photoresist layer, if present, may be any suitable photosensitive resist materials, such as an e-beam resist (for example, a chemically amplified resist (CAR)) and deposited and patterned in any suitable manner. The opening 412 may have a width less than 50 nm, such as less than 30 nm, such as between about 1 nm and about 10 nm, to form features in the gate electrode layer 406 with aspect ratio greater than at least 10:1.

Figure 4B:
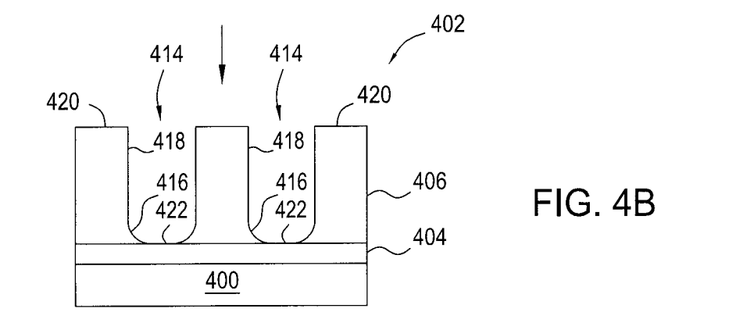

At operation 304, an etching process is performed to etch the gate electrode layer 406 to form features 414 in the gate electrode layer 406 until a portion 422 of the gate dielectric layer 404 is exposed, as shown in FIG. 4B. As discussed above, as the features 414 may have high aspect ratio, resulting in etchants from the etching process difficult to reach to bottom of the features 414. As a result, some corner residuals 416 of the gate electrode layer 406 may not be efficiently and effectively removed during the etching process, causing silicon recess formed between sidewall 418 of the gate electrode layer 406 and the exposed portion 422 of the gate dielectric layer 404. Thus, a gate electrode residual removal process will be later performed at operation 306 to remove the corner residuals 416 so as to form the features 414 in the gate electrode layer 406 with desired profiles and dimensions.

During the etching process at operation 304, the etching process may be performed at an etching reactor, such as the plasma processing chamber 200 depicted in FIG. 2. The etching process may be performed by supplying a etching gas mixture includes at least a halogen-containing gas and a fluorine carbon gas. Suitable examples of halogen-containing gas include HBr, HCl, $Cl_2$, $Br_2$, $NF_3$, combinations thereof, and the like. Suitable examples for the fluorine carbon gas include $CF_4$, $CHF_3$, $CH_2F_2$, $CH_3F$, $C_4F_8$, combinations thereof, and the like. Optionally, a carrier gas, such as $O_2$, $N_2$, $N_2O$, $NO_2$, combinations thereof, and the like, and an inert gas may be supplied with the etching gas mixture. Suitable examples of the inert gas include Ar, He, Kr, Ne, and the like. In one embodiment, the etching gas mixture for the main etch step may include HBr gas, $NF_3$ gas, $CF_4$ gas, $O_2$ gas, $N_2$ gas and He gas.

While performing the etching process, the chamber pressure of the etching gas mixture is also regulated. In one exemplary embodiment, a process pressure in the plasma processing chamber is regulated between about 2 mTorr to about 100 mTorr, for example, at about 7 mTorr. RF source power may be applied to maintain a plasma formed from the etching gas mixture. For example, a power of about 100 Watts to about 1500 Watts, such as about 300 Watts, may be applied to an inductively coupled antenna source to maintain a plasma inside the etch chamber. RF bias power may be applied between about 100 Watts to about 1000 Watts, such as about 150 and about 250 Watts. The etching gas mixture during the main etch may be flowed into the chamber at a rate between about 50 sccm to about 1000 sccm. For example, the halogen-containing gas may be supplied at a flow rate between about 5 sccm and about 500 sccm, such as 170 sccm. The fluorine and carbon gas may be supplied at a flow rate between about 5 sccm and about 500 sccm, such as between about 40 and about 70 sccm. The inert gas may be supplied at a flow rate between about 0 sccm and about 500 sccm. A substrate temperature is maintained between about 30 degrees Celsius to about 500 degrees Celsius. In another embodiment, the substrate temperature is maintained about greater than 80 degrees Celsius, such as greater than about 120 degrees Celsius, for example, about 150 degrees Celsius.

At operation 306, after the etching process removes most of the gate electrode layer 406 away to form openings 516 therein, a gate electrode residual removal process is performed to selectively remove the residuals 416 from the substrate 400. The gate electrode residual removal process performed at operation 306 may include two sub-operations 306a, 306b. The first sub-operation 306a includes a surface treatment process and a second sub-operation 306b includes a residual removal process. The residual removal process may utilize a remote plasma source. It is noted that the gate electrode residual removal process may be performed a plasma reactor comprising a remote plasma source, such as the plasma processing chamber depicted in FIGS. 1 and 2. In the embodiment wherein the gate electrode residual removal process is performed integrally (e.g., in-situ) with the etching process at operation 304, both processes may be performed in a plasma processing chamber that capable of performing a conventional etching process with a residual removal process utilizing a remote plasma source, such as processing chamber 200 depicted in FIG. 2 with the remote plasma source 277 coupled to the processing chamber 200.

Figure 4C:
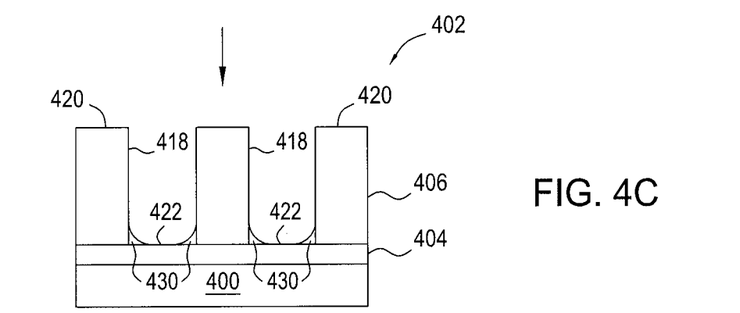

At the first sub-operation 306a, a surface treatment process is performed to treat the corner residuals 416, forming treated corner residuals 430 on the substrate surface. The surface treatment process is performed by supplying a treatment gas mixture into the processing chamber. The surface treatment process treats the corner residuals 416, modifying certain film/surface properties the corner residuals 416 to form the treated corner residuals 430 on the substrate 400, as shown in FIG. 4C.

The ions/radicals provided from the plasma generated in the treatment gas mixture change and/or modify part of the film properties of the corner residuals 416 (e.g., amorphousized the silicon materials in the gate electrode layer 406), so as to result in film bonding structures of the treated residuals 430 being different than other regions, such as sidewall 418 and upper surface 420 of the gate electrode layer 406. Dissimilarity in film properties among treated regions (e.g., the treated residuals 430) and untreated regions (e.g., the sidewall 418 and the upper surface 420) may provide a nature etching barrier between the treated residuals 430 and other materials remaining from the gate electrode layer 406, thus, providing high selectivity during the operation in the subsequent residual removal process.

The treatment process may alter the bonding structure to form the treated residuals 430 to form desired profile/film bonding structure change as needed, providing the treated residuals 430 with altered film properties that enable obtaining different process results during the subsequent etching processes.

In one embodiment, the treatment gas may include at least an inert gas. Suitable examples of the inert gas include Ar, He, Kr, Ne, Xe or the like. When an inert gas is selected as the ion treatment gas, the atoms from the inert gas physically bombard and collide with the atoms made up the corner residuals 416. As the power applied to the plasma during the treatment process may provide momentum to the atoms from the inert gas, so when colliding with the atoms from the corner residuals 416, the bonding structures in the corner residuals 416 may be damaged and rearranged, thus resulting a damaged/loose bonding structures to the areas selected to be treated, as compared to the untreated upper surface 420 and the sidewall 418 of the gate electrode layer 406. As the atoms from the inert gas damage and loosen the bonding structures present in the corner residuals 416, the resultant treated corner residuals 430 may also have a damaged bonding structure, which may be easily etched and removed away by a residual removal process. In the embodiment wherein the corner residuals 416 is made from a crystalline silicon material, the atoms from the insert gas may collide the lattice structure of the silicon atoms in the crystalline silicon material of the corner residuals 416, destroying and damaging the lattice structure of the silicon material, thus amorphizating the silicon material and turning it into an amorphous silicon layer. In this example, the treated corner residuals 430 as formed turns mostly into amorphous silicon layers, as a result of the collisions of inert gas during the treatment process. By doing so, the amorphous type treated corner residuals 430 may be easily attacked and etched away in the subsequent residual removal process at the second sub-operation 306b, thus providing a good etching selectivity during the subsequent residual etching process.

In one embodiment, inert gas with high molecular weight, such as Ar, Ne, or Kr, with a controlled directionality (e.g., controlled by directional bias power) may be selected to perform the treatment process. As these elements have relatively high molecular weight, a relatively higher collision power may be obtained when striking the corner residuals 416 so as to provide an efficient collision to alter and damage the lattice structure of the corner residuals 416 to facilitate the following residual removal process.

Several process parameters may be controlled during the treatment process at the second sub-operation 306b. The inert gas may be supplied into the processing chamber at a flow rate between about 1 sccm and about 500 sccm, such as between about 100 sccm and about 300 sccm, for example about 200 sccm. The chamber pressure is generally maintained between about 0.1 mTorr and about 100 mTorr, for example between about 4.5 mTorr and about 65 mTorr, such as about 10 mTorr. A RF power, such as capacitive or inductive RF power, DC power, electromagnetic energy, or magnetron sputtering, may be supplied into the processing chamber 200 to assist dissociating the gas mixture during processing. Ions generated by the dissociative energy may be accelerated toward the substrate using an electric field produced by applying a DC or RF electrical bias to the substrate support or to a gas inlet above the substrate support, or both. The electric field provided by the RF source power of about 13.5 MHz may be capacitively or inductively coupled for purposes of ionizing the atoms, and may be a DC discharge field or an alternating field, such as an RF field. Alternately, microwave energy may be applied to the ion implanting gas mixture containing any of these elements to generate ions. In some embodiments, the gas containing energetic ions may be a plasma. An electrical bias (peak to peak voltage) of between about 20 V and about 1000 V is applied to the substrate support, the gas distributor, or both, to accelerate the ions toward the substrate surface with the desired energy. In some embodiments, the electrical bias is also used to ionize the treatment gas mixture. In other embodiments, a second electric field is used to ionize the process gas. In one embodiment, a RF bias power with a frequency of about 2 MHz is provided to ionize the ion implantation processing gas and bias the substrate support at a power level between about 10 W and about 500 W, such as about 50 W and about 300 W, for example about 200 W. The ions thus produced will generally be accelerated toward the substrate by biasing the substrate or a gas distributor as described above. In one embodiment, the RF source power may be supplied at between about 100 Watts to about 500 Watts, and the bias power may be supplied at between about 50 Watts and about 300 Watts. In one particular example, the RF bias power is controlled at about 200 W without RF source power applied.

In some embodiments, the power used to generate ions may be pulsed as needed. Power may be applied to the plasma source for a desired time, and then discontinued for a desired time. Power cycling may be repeated for a desired number of cycles at a desired frequency and duty cycle. In some embodiments, the plasma may be pulsed at a frequency between about 1 Hz and about 50,000 Hz, such as between about 5000 Hz and about 10000 Hz. In other embodiments, the plasma pulsing may proceed with a duty cycle (ratio of powered time to unpowered time per cycle) between about 10% and about 90%, such as between about 30% and about 70%. The process temperature may be controlled at between about 5 degrees Celsius and about 650 degrees Celsius, such as between about 200 degrees and about 400 degree Celsius, for example about 310 degrees Celsius.

Figure 4D:
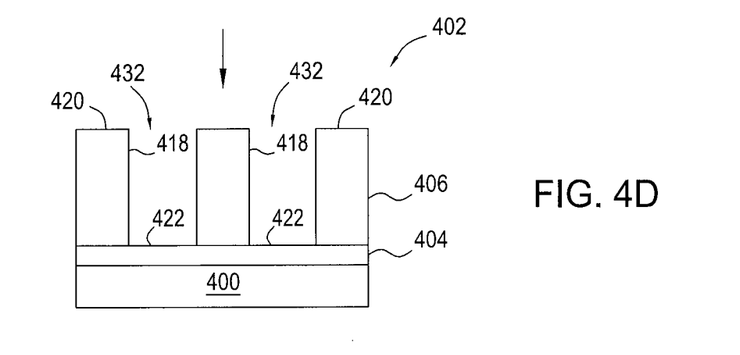

At the second sub-operation 306b, after the treatment process, a residual removal process is then performed to remove the treated residuals 430 from the substrate 400, as shown in FIG. 4D, forming features 432 with desired profile and dimension in the gate electrode layer 406. The residual removal gas mixture is supplied into a processing chamber with a remote plasma source, such as the processing chamber 200 depicted in FIG. 2, or the remote plasma cavity 150 in FIG. 1, to remove the treated corner residuals 430, until the portion 422 of the gate dielectric layer 404 is exposed to a desired width. As discussed above, the treated corner residuals 430 itself servers as an etching barrier layer during the residual process with high selectivity to the upper surface 420 and sidewall 418 of the gate electrode layer 406 as well as the gate dielectric layer 404.

The residual removal gas mixture selected to remove the treated region 711 includes at least a hydrogen-containing gas, such as $H_2$ or the like supplied from a remote plasma source, or from a plasma maintained in the processing chamber as needed. The plasma supplied from the remote source may provide a gentle source that may mildly and gradually remove the treated residuals 430 without overly attacking other materials remained in the gate electrode layer 406 and the gate dielectric layer 404. In one example, a $H_2$ gas is utilized to form a remote plasma source to remove the treated residuals. The hydrogen gas may be supplied to the processing chamber at a flow rate by volume between about 5 sccm and about 2000 sccm, such as about 400 sccm.

While supplying the residual removal gas mixture, an inert gas may optionally be supplied into the residual removal gas mixture to assist the profile control as needed. Examples of the inert gas supplied in the gas mixture include Ar, He, Ne, Kr, Xe or the like. The optional inert gas may be supplied to the processing chamber at a flow rate by volume between about 50 sccm and about 300 sccm.

After the residual removal gas mixture is supplied to the processing chamber mixture, a RF power of remote plasma source may be supplied in the etching gas mixture for between about 200 Watts and about 3000 Watts. The a RF power of remote plasma source may be supplied at the residual removal gas mixture between about 1000 Watts and about 3000 Watts and at a frequency between about 400 kHz and about 60 MHz. A RF bias power may also optionally be supplied as needed as needed.

Several process parameters may also be controlled while supplying the residual removal gas mixture to perform the residual removal process. The pressure of the processing chamber may be controlled at between about 75 milliTorr and about 20 Torr. A substrate temperature is maintained between about 15 degrees Celsius to about 300 degrees Celsius, such as greater than 500 degrees Celsius, for example between about 200 degrees Celsius and about 400 degrees Celsius, such as about 310. It is believed that high temperature, temperature greater than 200 degrees Celsius, helps reduce the amount of byproduct generated during the residual removal process.

It is noted that the treatment process at sub-operation 316a and the residual removal process at sub-operation 316b may be repeatedly and cyclically formed, as shown in the loop 308, to incrementally and gradually remove and etch away the treated residuals 430 substantially without attacking other regions of the gate electrode layer 406 and the gate dielectric layer 404.

In one example, the processes between the treatment process at sub-operation 316a and the residual removal process at sub-operation 316b may be repeated performed for about 3 to 10 cycles. Each cycle of each process may be controlled between about 15 seconds and about 45 seconds. It is noted that numbers of the cycles between the treatment process at sub-operation 316a and the residual removal process at sub-operation 316b may be as many as needed.

Thus, methods for forming features with high aspect ratio for gate structure with desired profile and dimensions for three dimensional (3D) stacking of semiconductor chips are provided. The methods utilize treatment process to treat gate electrode residuals remaining after an etching process to form treated residuals with different/mismatched film properties from other materials on the substrate so as to promote etching selectivity. A residual removal process is utilized to selectively remove residuals with mismatched film properties to form desired high aspect ratio features in the gate electrode layer with desired profiles and dimension. As such, a gate structure with uniform and desired profile of high aspect ratios is then obtained.

While the foregoing is directed to embodiments of the present invention, other and further embodiments of the invention may be devised without departing from the basic scope thereof, and the scope thereof is determined by the claims that follow.

What is claimed is:

1. A method for forming high aspect ratio features in a gate electrode layer in a gate structure, the method comprising:
    performing a surface treatment process on gate electrode residuals remaining on a gate structure disposed on a substrate;
    selectively forming a treated residual on the gate structure on the substrate with adjacent untreated regions on the gate structure;

performing a remote plasma residual removal process to remove the treated residual from the substrate; and
forming a remote plasma from a gas mixture including a hydrogen-containing gas.

2. The method of claim 1, wherein the hydrogen-containing gas is $H_2$.

3. The method of claim 1, wherein performing the surface treatment process comprises:
supplying a treatment gas mixture including an inert gas.

4. The method of claim 1, wherein the inert gas is Ar gas or Ne gas.

5. The method of claim 1, wherein forming the treated region further comprises:
causing changes in the lattice structure of the gate electrode residuals with atoms from the inert gas to form an amorphous film structure.

6. The method of claim 1, wherein the surface treatment causes a silicon material to be amorphized.

7. The method of claim 1, wherein the treated residual and the adjacent untreated regions have a different etching rate, providing an etching selectivity during the residual removal process.

8. The method of claim 1, wherein the gate electrode layer is a polysilicon layer.

9. The method of claim 1, wherein performing the surface treatment process further comprises:
supplying a RF bias power during the surface treatment process without RF source power.

10. The method of claim 1, further comprising:
performing a gate electrode layer etching process prior to performing the surface treatment process to form the gate structure, the etching process leaving some gate electrode residuals in the gate structure.

11. The method of claim 10, wherein the gate electrode layer etching process, the treatment process, and the remote plasma residual removal process are performed in a single chamber.

12. The method of claim 10, further comprising:
forming features with high aspect ratio greater than 10:1 in the gate electrode layer with gate electrode residuals remaining on the substrate.

13. The method of claim 1, further comprising:
cyclically performing the surface treatment process and the residual removal process until the gate electrode residuals are substantially removed from the substrate.

14. A method for forming high aspect ratio features in a gate electrode layer in a gate structure, the method comprising:
performing an surface treatment process on gate electrode residuals remaining on a gate structure disposed on a substrate;
selectively forming a treated residual on the gate structure on the substrate with adjacent untreated regions on the gate structure; and
performing a remote plasma residual removal process to remove the treated residual from the substrate, wherein performing the remote plasma residual removal process comprises:
maintaining a substrate temperature greater than 200 degrees Celsius.

15. A method for forming high aspect ratio features in a gate electrode layer in a gate structure, the method comprising:
performing an surface treatment process on gate electrode residuals remaining on a gate structure disposed on a substrate;
selectively forming a treated residual on the gate structure on the substrate with adjacent untreated regions on the gate structure, wherein the gate electrode residuals are formed at a corner between sidewalls of a gate electrode and a surface of a gate dielectric layer disposed in the gate structure; and
performing a remote plasma residual removal process to remove the treated residual from the substrate.

16. The method of claim 15, wherein the gate dielectric layer is a silicon oxide layer, silicon nitride layer, silicon oxynitride layer, high-k materials, or combinations thereof.

17. A method for forming high aspect ratio features in a gate electrode layer in a gate structure, the method comprising:
altering film properties of gate electrode residuals on a gate structure formed on a substrate, wherein altering film properties of the gate electrode residuals further comprises:
performing a surface treatment process by supplying an inert gas into a processing chamber where the substrate is disposed; and
selectively removing the gate electrode residuals from the substrate.

18. A method for forming high aspect ratio features in a gate electrode layer in a gate structure, the method comprising:
altering film properties of gate electrode residuals on a gate structure formed on a substrate; and
selectively removing the gate electrode residuals from the substrate, wherein selectively removing the gate electrode residuals further comprising:
performing a remote plasma residual removal process by supplying a treatment gas mixture including hydrogen-containing gas from a remote plasma source.

19. A method for forming high aspect ratio features in a gate electrode layer in a gate structure, the method comprising
selectively treating gate electrode residuals remaining on a substrate after patterning a gate electrode layer disposed in a gate structure formed on a substrate; and
selectively removing the treated gate electrode residuals from the gate structures by a remote plasma source generated from a gas mixture containing $H_2$.

* * * * *

UNITED STATES PATENT AND TRADEMARK OFFICE
CERTIFICATE OF CORRECTION

PATENT NO. : 9,640,385 B2  
APPLICATION NO. : 15/000273  
DATED : May 2, 2017  
INVENTOR(S) : Bhargav Citla et al.

Page 1 of 1

It is certified that error appears in the above-identified patent and that said Letters Patent is hereby corrected as shown below:

In Column 7, Line 3, delete "MCl," and insert -- HCl, --, therefor.

In Column 15, Line 10, in Claim 4, delete "claim 1," and insert -- claim 3, --, therefor.

In Column 16, Line 54, in Claim 19, delete "$H_2$." and insert -- $H_2$ gas. --, therefor.

Signed and Sealed this  
Twenty-seventh Day of June, 2017

Joseph Matal  
*Performing the Functions and Duties of the  
Under Secretary of Commerce for Intellectual Property and  
Director of the United States Patent and Trademark Office*